United States Patent
Eisenberg et al.

(10) Patent No.: US 10,516,371 B2
(45) Date of Patent: Dec. 24, 2019

(54) POWER CONVERTING SYSTEM

(71) Applicant: LG Electronics Inc., Seoul (KR)

(72) Inventors: John A. Eisenberg, Los Altos, CA (US); David S. Wisherd, Carmel, CA (US)

(73) Assignees: Cool Dry, Inc., Santa Clara, CA (US); LG Electronics Inc., Seoul (KR)

( * ) Notice: Subject to any disclaimer, the term of this patent is extended or adjusted under 35 U.S.C. 154(b) by 0 days.

(21) Appl. No.: 15/657,075

(22) Filed: Jul. 21, 2017

(65) Prior Publication Data
US 2018/0026590 A1    Jan. 25, 2018

Related U.S. Application Data

(60) Provisional application No. 62/493,967, filed on Jul. 21, 2016.

(51) Int. Cl.
*H03F 3/19* (2006.01)
*H02M 7/04* (2006.01)
*H03F 3/21* (2006.01)
*H03F 3/217* (2006.01)
*H02M 7/162* (2006.01)

(52) U.S. Cl.
CPC .............. *H03F 3/19* (2013.01); *H02M 7/04* (2013.01); *H03F 3/21* (2013.01); *H03F 3/2173* (2013.01); *H03F 3/2176* (2013.01); *H02M 7/162* (2013.01); *H02M 7/1626* (2013.01); *H03F 2200/451* (2013.01)

(58) Field of Classification Search
CPC ...... H02M 7/162; H02M 7/1626; H02M 7/04; H03F 3/19; H03F 3/2176; H03F 3/2173; H03F 3/21; H03F 2200/451
See application file for complete search history.

(56) References Cited

U.S. PATENT DOCUMENTS

| | | | |
|---|---|---|---|
| 9,425,700 B2 * | 8/2016 | Lu | H02M 3/3376 |
| 2005/0281059 A1 * | 12/2005 | Yasumura | H02M 1/4241 363/16 |
| 2008/0174276 A1 * | 7/2008 | Takahashi | H02J 9/061 320/128 |
| 2008/0258701 A1 | 10/2008 | Liu et al. | |
| 2008/0259647 A1 | 10/2008 | Risseeuw | |

(Continued)

OTHER PUBLICATIONS

International Search Report and Written Opinion in International Application No. PCT/US2017/043413, dated Nov. 2, 2017, 12 pages.

*Primary Examiner* — Kyle J Moody
(74) *Attorney, Agent, or Firm* — Fish & Richardson P.C.

(57) ABSTRACT

A power converting system that includes: a rectifier configured to convert an input voltage into a output voltage and including an output node that is coupled to floating ground; a radio frequency (RF) power amplifier coupled to the rectifier and configured to generate a load voltage based on an RF clock and the output voltage; a detector coupled to the RF power amplifier and configured to detect the load voltage of the RF power amplifier; an integrator coupled to the detector and configured to generate a direct current (DC) voltage based on the detected load voltage; and a controller coupled to the integrator and configured to, based on the DC voltage, generate a control signal to adjust one or more features of the RF power amplifier is disclosed.

31 Claims, 12 Drawing Sheets

(56) References Cited

U.S. PATENT DOCUMENTS

| | | | |
|---|---|---|---|
| 2012/0033451 A1* | 2/2012 | Usui | H02M 1/4258 363/21.02 |
| 2013/0141062 A1 | 6/2013 | Khlat | |
| 2013/0200721 A1* | 8/2013 | Kurs | H04B 5/0037 307/104 |
| 2014/0232458 A1 | 8/2014 | Arno et al. | |
| 2014/0361742 A1* | 12/2014 | Chung | B60L 11/1812 320/109 |
| 2016/0016479 A1* | 1/2016 | Khaligh | B60L 11/1812 363/17 |
| 2016/0056770 A1 | 2/2016 | Delepaut et al. | |
| 2017/0093269 A1* | 3/2017 | Qiu | H02M 1/083 |
| 2017/0188420 A1* | 6/2017 | Kido | H05B 33/089 |
| 2018/0054089 A1* | 2/2018 | Lee | H02J 50/10 |
| 2018/0076713 A1* | 3/2018 | Kokusho | H02M 3/33569 |

* cited by examiner

POWER CONVERTING SYSTEM

CROSS-REFERENCE TO RELATED APPLICATION

This application is a non-provisional of and claims priority to U.S. Provisional Patent Application No. 62/493,967, filed on Jul. 21, 2016, the entire contents of which are hereby incorporated by reference.

TECHNICAL FIELD

This disclosure relates generally to electronics and more particularly to a power converting system that converts an alternating current (AC) line voltage to radio frequency (RF) energy for one or more devices.

BACKGROUND

A traditional power converting system that generates RF power from an AC line voltage usually includes a full wave bridge rectifier. However, the full wave bridge rectifier offers a poor power factor so that the full wave bridge rectifier is not an effective power supply solution.

SUMMARY

To provide a 50 W to multi-kW source of RF power for use in appliances such as dryers, cooking appliances, industrial heaters, dialectic heaters, medical RF ablation systems, induction heaters, or radio transmitters, a power converting system operates at frequencies between 100 kHz and 100 MHz with emphasis on the ISM frequency bands at 13.56 MHz, 27.12 MHz, or 40.68 MHz. The power converting system can include a phase shifter or a pulse width controller to control output of a RF power amplifier that is used as a RF source for appliances. The RF power amplifier is powered by a rectifier. In particular, the RF power amplifier can be powered by a Valley Fill rectifier. The output of the RF amplifier is adjustable over at least a 10 dB range.

In general, one innovative aspect of the subject matter described in this specification can be implemented in a power converting system comprising: a rectifier configured to convert an input voltage into a output voltage and including an output node that is coupled to floating ground; a radio frequency (RF) power amplifier coupled to the rectifier and configured to generate a load voltage based on an RF clock and the output voltage; a detector coupled to the RF power amplifier and configured to detect the load voltage of the RF power amplifier; an integrator coupled to the detector and configured to generate a direct current (DC) voltage based on the detected load voltage; and a controller coupled to the integrator and configured to, based on the DC voltage, generate a control signal to adjust one or more features of the RF power amplifier.

The foregoing and other implementations can each optionally include one or more of the following features, alone or in combination. In particular, one implementation includes all the following features in combination. The power converting system further includes: a reference voltage generator configured to generate a reference voltage, wherein the controller is configured to: compare the output signal to the reference voltage, based on the comparison of the output signal to the reference voltage, generate the control signal. The reference voltage represents a desired RF output power of the power converting system. The power converting system further includes: a coupler coupled to the RF power amplifier and configured to transfer output of the RF power amplifier to the detector. The coupler is a directional coupler that is configured to sense the output of the RF power amplifier delivered to a RF load. The load voltage of the RF power amplifier is provided to a RF load. The RF load includes one or more resistors. The power converting system further includes: a RF clock generator coupled to the RF power amplifier and configured to provide the RF clock to the RF power amplifier. A frequency of the RF clock is an operating frequency of the power converting system. The controller is configured to: based on the DC voltage, generate the control signal to adjust a phase of the RF clock. The RF power amplifier includes: a phase shifter configured to: receive the control signal from the controller, and based on the control signal, adjust the phase of the RF clock. The RF power amplifier includes: a first switching unit that is configured to receive the RF clock, a second switching unit that is configured to receive the RF clock, a third switching unit that is configured to receive the RF clock through the phase shifter, and a fourth switching unit that is configured to receive the RF clock through the phase shifter, wherein the phase shifter is configured to adjust the phase of the RF clock and provide the phase adjusted RF clock to the third switching unit and the fourth switching unit. The second switching unit and the third switching unit are coupled to floating ground. The RF power amplifier further includes: a resonant circuit having a first resonant frequency, and wherein an operating frequency of the RF power amplifier is the same as the first resonant frequency. The operating frequency of the RF power amplifier is between 100 kHz and 100 MHz. The RF power amplifier includes: a fifth switching unit that is configured to receive the RF clock, and a sixth switching unit that is configured to receive the RF clock, and wherein the phase shifter is configured to adjust the phase of the RF clock and provide the phase adjusted RF clock to the fifth switching unit and the sixth switching unit. The fifth switching unit and the sixth switching unit are coupled to floating ground. The RF power amplifier further includes: a resonant circuit having a first resonant frequency, and wherein an operating frequency of the RF power amplifier is the same as the first resonant frequency. The operating frequency of the RF power amplifier is between 100 kHz and 100 MHz. The controller is configured to: based on the DC voltage, generate the control signal to adjust a pulse width of the RF clock. The RF power amplifier includes: a pulse width controller that is configured to: receive the control signal from the controller, and based on the control signal, adjust the pulse width of the RF clock. The RF power amplifier includes: a first switching unit that is configured to receive the RF clock through the pulse width controller, a second switching unit that is configured to receive the RF clock through the pulse width controller, a third switching unit that is configured to receive the RF clock through the pulse width controller, and a fourth switching unit that is configured to receive the RF clock through the pulse width controller, wherein the pulse width controller is configured to adjust the pulse width of the RF clock and provide the pulse width-adjusted RF clock to the first switching unit, the second switching unit, the third switching unit, and the fourth switching unit. The second switching unit and the third switching unit are coupled to floating ground. The RF power amplifier further includes: a resonant circuit having a first resonant frequency, and wherein an operating frequency of the RF power amplifier is the same as the first resonant frequency. The operating frequency of the RF power amplifier is between 100 kHz and 100 MHz. The RF power amplifier includes: a fifth switching unit that is configured to receive the RF clock, and a sixth switching unit that is configured to receive the RF clock, and wherein the pulse width controller is configured to adjust the pulse width of the RF clock and provide the pulse width-adjusted RF clock to the fifth switching unit and the sixth switching unit. The fifth switching unit and the sixth switching unit are coupled to floating ground. The RF power amplifier further includes: a resonant circuit having a first resonant frequency, and wherein an operating frequency of the RF power amplifier is the same as the first resonant frequency. The operating frequency of the RF power amplifier is between 100 kHz and 100 MHz. The rectifier is a Valley Fill rectifier. An operating frequency of the RF power amplifier is between 13 and 14 MHz.

The subject matter described in this specification can be implemented in particular implementations so as to realize one or more of the following advantages. Comparing to a conventional power converting system, the power converting system described above maximizes AC line to RF power output conversion efficiency. The power converting system also maximizes AC input power factor (PF) so that the RF power amplifier can deliver maximum RF output power within the ratings of standard AC line current protection devices and meet international standards for appliance power factor. Moreover, the RF power amplifier is designed to minimize heating of a RF power metal-oxide-semiconductor field-effect transistor (MOSFET) or other switching devices used when the power supply is delivering peak output voltage such that the life of the RF power MOSFET and the switching devices can be maximized. Furthermore, the power converting system provides a cost-effective solution.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements.

DETAILED DESCRIPTION

Figure 1A:
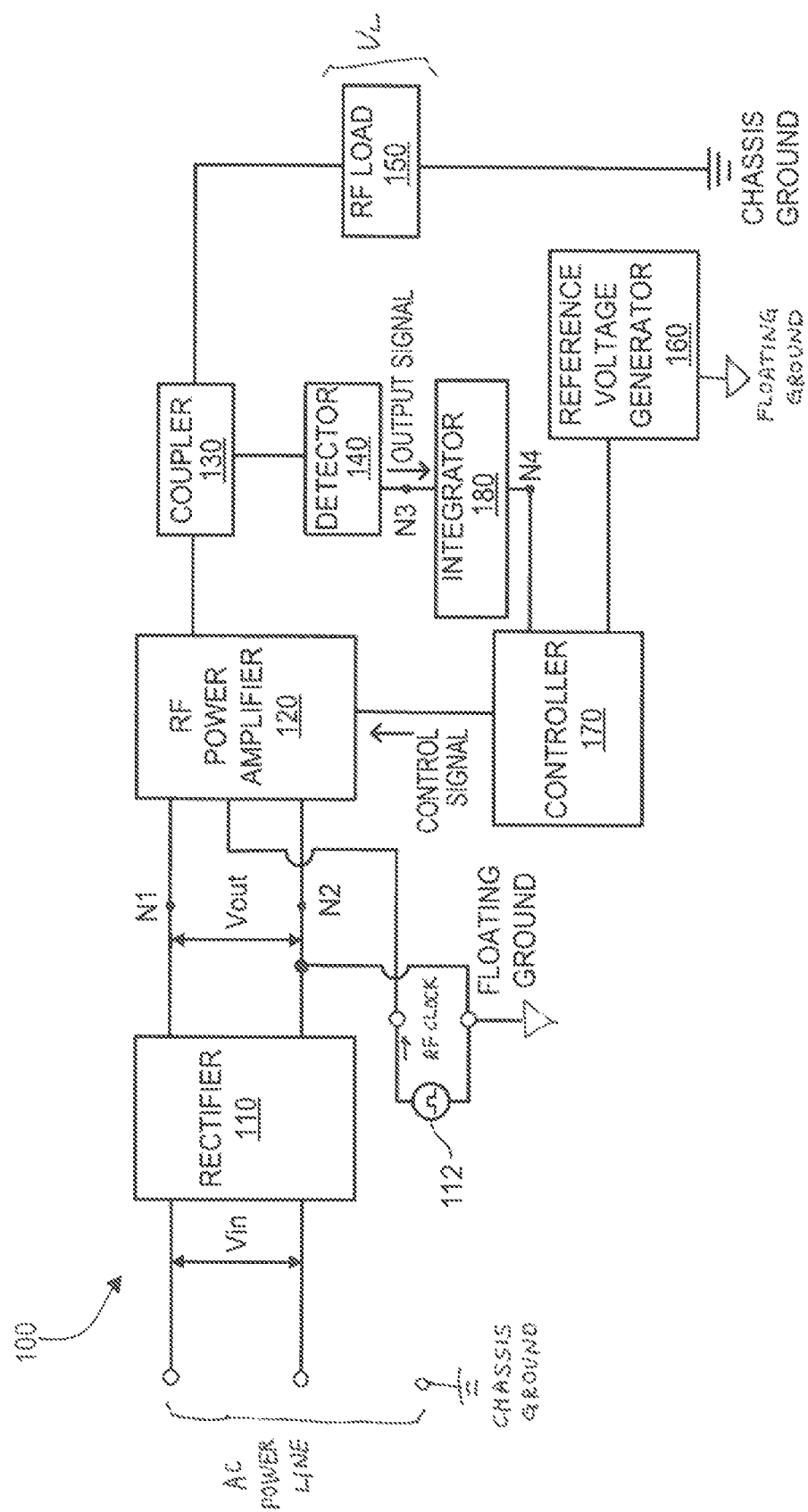
FIG. 1A is a diagram illustrating an example power converting system.

FIG. 1A illustrates an example power converting system 100. The power converting system 100 includes a rectifier 110, a RF clock generator 112, a radio frequency (RF) power amplifier 120, a coupler 130, a detector 140, a RF load 150, a reference voltage generator 160, and the controller 170. The power converting system 100 may be implemented with an integrated circuit or with a combination of integrated circuits and/or individual discrete components. The power converting system 100 can be included in various electronic systems, including but not limited to: dryers, cooking appliances, industrial heaters, dialectic heaters, medical RF ablation systems, induction heaters, or radio transmitters.

The rectifier 110 converts an input voltage (Vin) into an output voltage (Vout). Input of the rectifier 110 is coupled to an AC power line having a particular frequency, e.g., 60 Hz. In some implementations, the rectifier 110 can be a single-phase rectifier or a multi-phase rectifier, such as a three-phase rectifier. In some implementations, the rectifier 110 can be a full wave bridge rectifier. A full wave bridge rectifier provides excellent power efficiency. In some other implementations, the rectifier 110 can be a Valley Fill rectifier. A Valley Fill rectifier improves power factor and power efficiency. In addition, a Valley Fill rectifier is cost-effective.

In some implementations, a transformer operating at the AC power line frequency is not required for the rectifier 110. Thus, the rectifier 110 is not isolated from the AC power line. In some implementations, to prevent a safety hazard, elements of the rectifier 110 and elements following output of the rectifier 110 are coupled to floating ground rather than chassis ground. For example, floating ground can be a common node that other voltages in the power converting system 100 are referenced to but is not tied to chassis or earth ground.

During operation of the RF power amplifier 120, the RF clock generator 112 provides an RF clock to the RF power amplifier 120. The RF clock generator 112 is coupled to floating ground. An RF output frequency of the power converting system 100 is determined by the frequency of the RF clock.

The RF power amplifier 120 is coupled to the output of the rectifier 110. The output of the rectifier 110 is coupled to an input of the RF power amplifier 120. The ground in the RF power amplifier 120 is isolated from chassis ground. One or more circuit elements requiring a connection to ground in the RF power amplifier 120 are coupled to floating ground. The RF power amplifier 120 is driven by the RF clock. In some implementations, the RF power amplifier 120 can be a class D, class DE, class E, or class F RF power amplifiers with various topologies. For example, a push pull and full bridge topology offer special advantages for RF power amplifiers requiring control of RF output power. The RF power amplifier 120 provides power to the RF load 150 through the coupler 130. The load voltage ($V_L$) across the RF load 150 can be the output voltage of the power converting system 100. In some implementations, the RF load 150 can include one or more resistances. In some implementations, RF power amplifier 120 includes a transformer. Where the RF power amplifier 120 includes a transformer, the RF load 150 is isolated from the input of the RF power amplifier 120. Thus, the RF load 150 may be coupled to chassis ground.

The coupler 130 also transfers the output of the RF power amplifier 120 to the detector 140. In some implementations, the coupler 130 can be a directional coupler. That is, the coupler 130 detects RF signals flowing in one direction, e.g., a direction from the RF power amplifier 120 to the RF load 150.

The detector 140 is coupled to the output of the coupler 130. The detector 140 detects the output voltage of the RF power amplifier 120 and generates an output signal (OutputSignal). The detector 140 provides the output signal (OutputSignal) to the integrator 180. The integrator 180 converts the output signal (OutputSignal), which may be a complex waveform, to a DC voltage. The integrator 180 provides the converted DC voltage to the controller 170.

The reference voltage generator 160 generates a reference voltage (Vref) and provides the reference voltage (Vref) to the controller 170. The reference voltage (Vref) represents the desired output power level of the power converting system 100.

The controller 170 receives, as input, the DC voltage from the integrator 180 and the reference voltage (Vref) from the reference voltage generator 160. The controller 170 compares the DC voltage to the reference voltage (Vref). Based on the comparison of the DC voltage to the reference voltage (Vref), the controller 170 generates a control signal to control the RF power output of the power converting system 100. For example, the controller 170 can calculate the difference between the DC voltage and the reference voltage (Vref). The controller 170 determines whether the difference satisfies a threshold, e.g., the difference is above the threshold or below the threshold. Based on a determination that the difference satisfies the threshold, the controller 170 can generate a control signal to control the RF power output of the power converting system 100.

The control signal generated by the controller 170 adjusts one or more features of the RF power amplifier 120 to control the RF power output of the power converting system 100. In some implementations, the control signal generated by the controller 170 can adjust the phase of the RF clock within the RF power amplifier 120 to control the load voltage ($V_L$). In some other implementations, the control signal generated by the controller 170 can adjust a pulse width of the RF clock within the RF power amplifier 120 to control the load voltage ($V_L$). By controlling the load voltage ($V_L$), the power converting system 100 can reduce power consumption of the power converting system 100.

Figure 1B:
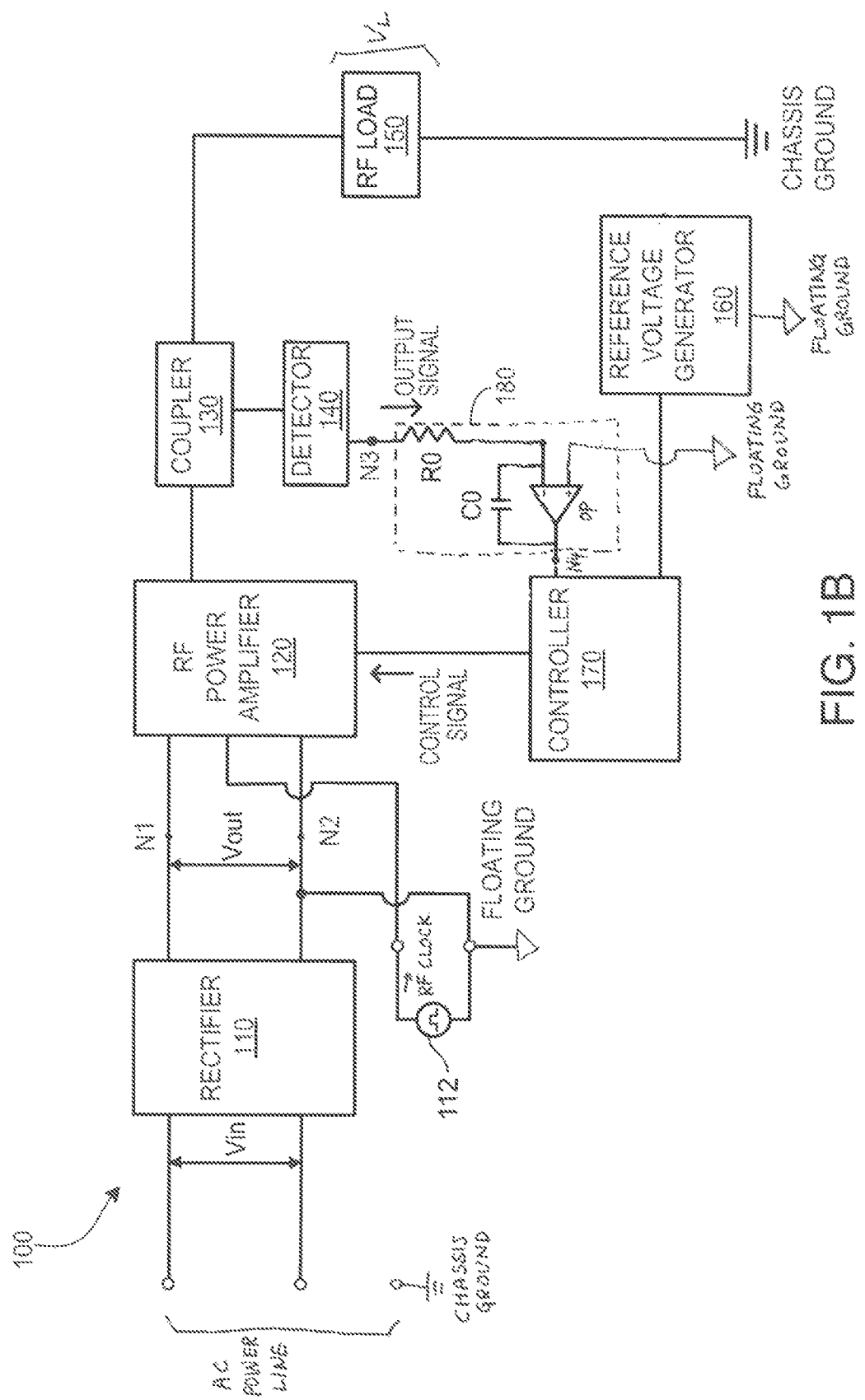
FIG. 1B is a diagram illustrating another example power converting system.

FIG. 1B illustrates another example power converting system 100. In FIG. 1B, the integrator 180 includes a capacitor C0, a resistor R0, and an op amp OP. The resistor R0 is coupled between the node N3 and the node N4 and the capacitor C0 is coupled between the node N4 and the node N5. The node N3 is coupled to the output of detector 140, the node N4 is coupled to a first inverting input terminal of the op amp OP. A second non-inverting input terminal of the op amp OP is coupled to floating ground. The integrator 180 converts the output signal (OutputSignal) from the detector 140 to a DC voltage. The converted DC voltage is provided to the controller 170. The operation of the controller 170 is the same as the controller 170 illustrated in FIG. 1A.

Figure 2A:
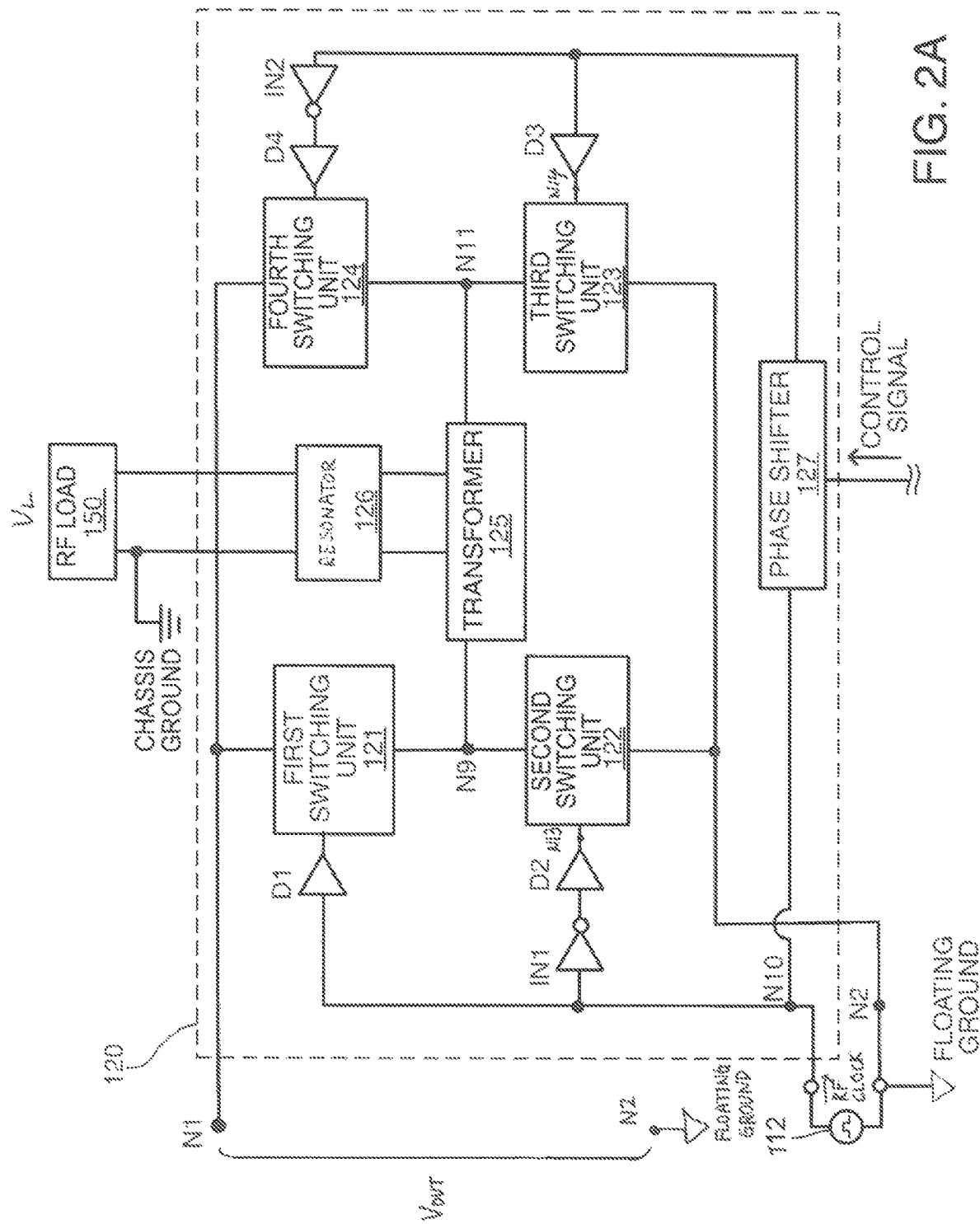
FIG. 2A is a diagram illustrating an example RF power amplifier including a phase shifter 127.

FIG. 2A illustrates an example RF power amplifier 120 including a phase shifter 127. In some implementations, the phase shifter 127 can be an analog phase shifter. In some other implementations, the phase shifter 127 can be a digital phase shifter. The RF power amplifier 120 includes a first switching unit 121, a second switching unit 122, a third switching unit 123, a fourth switching unit 124, a transformer 125, a resonator 126, and a phase shifter 127. The switching units 121-124 can be implemented with a various kinds of transistors including, but not limited to: P-channel MOSFETs, N-channel MOSFETs, LDMOS transistors, Silicon MOSFETs, Silicon Carbide MOSFETs, Silicon Bipolar Transistors, Silicon IGBTs, Silicon JFETs, Silicon Carbide JFETs, Gallium Nitride High Electron Mobility Transistors (GaN HEMTs), GaAs MESFETs, or any suitable types of transistors.

In some implementations, the switching units 121-124 can be respectively driven by a suitable high current driver D1-D4 to charge or discharge input capacitance of the switching units 121-124. For example, a suitable high current driver can charge the input capacitance within 5% of the RF signal's period. The high current driver can be controlled by transistor-transistor logic (TTL) or CMOS signals. As a result, the power converting system 100 can have a simple interface to digital or analog control the phase shifter 127 or pulse width controller 128.

In some implementations, the switching units 121-124 are the same type of transistors. For example, the switching units 121-124 are N-channel Silicon MOSFETs. In these implementations, the RF power amplifier 120 can include inverters for the second switching unit 122 and the fourth switching unit 124. Alternatively, the RF power amplifier 120 can include inverters for the first switching unit 121 and the third switching unit 123. In some other implementations, the first switching unit 121 and the third switching unit 123 are the same type of transistors and the second switching unit 122 and the fourth switching unit 124 are the same type of transistors. For example, the first switching unit 121 and the third switching unit 123 are N-channel Silicon MOSFETs and the second switching unit 122 and the fourth switching unit 124 are P-channel Silicon MOSFETs. In these implementations, the RF power amplifier 120 does not include inverters. The operations of the switching units 121-124 are described in greater detail below The first switching unit 121 is coupled between the node N1 and a node N9. The first switching unit 121 is turned on or off in response to the RF clock. For example, when the RF clock is high, the first switching unit 121 is turned on. When the RF clock is low, the first switching unit 121 is turned off. In some implementations, the RF power amplifier 120 additionally includes a driver D1 that is coupled between the node N10 and the first switching unit 121 to drive the first switching unit 121.

The second switching unit 122 is coupled between the node N9 and the node N2. The second switching unit 122 is turned on or off in response to the RF clock. For example, when the RF clock is high, the second switching unit 122 is turned off. When the RF clock is low, the second switching unit 122 is turned on. In some implementations, the RF power amplifier 120 can include an inverter IN1 between the node N10 and the second switching unit 122. In these implementations, the first switching unit 121 and the second switching unit 122 are the same type of transistors. In some implementations, the second switching unit 122 can be a different type of transistor from the first switching unit 121. For example, if the first switching unit 121 is a P-channel Silicon MOSFET, the second switching unit 122 is an N-channel Silicon MOSFET. In these implementations, the RF power amplifier 120 does not include an inverter. In some implementations, the RF power amplifier 120 additionally includes a driver D2 between the node N10 and the second switching unit 122 to drive the second switching unit 122.

The third switching unit 123 is coupled between the node N2 and a node N11. The third switching unit 123 is turned on or off in response to the RF clock. For example, where the phase of the RF clock is not shifted by the phase shifter 127, when the RF clock is high, the third switching unit 123 is turned on. When the RF clock is low, the third switching unit 123 is turned off. As another example, where the phase of the RF clock is shifted by the phase shifter 127, when the RF clock is high, the third switching unit 123 can be turned on or off based on how much the phase of the RF clock is shifted. When the RF clock is low, the third switching unit 123 can be turned on or off based on how much the phase of the RF clock is shifted. In some implementations, the RF power amplifier 120 additionally includes a driver D3 that is coupled between the phase shifter 127 and the third switching unit 123 to drive the third switching unit 123.

The fourth switching unit 124 is coupled between the node N11 and the node N1. The fourth switching unit 124 is turned on or off in response to the RF clock. For example, where the phase of the RF clock is not shifted by the phase shifter 127, when the RF clock is high, the fourth switching unit 124 is turned off. When the RF clock is low, the fourth switching unit 124 is turned on. As another example, where the phase of the RF clock is shifted by the phase shifter 127, when the RF clock is high, the fourth switching unit 124 can be turned on or off based on how much the phase of the RF clock is shifted. When the RF clock is low, the fourth switching unit 124 can be turned on or off based on how much the phase of the RF clock is shifted. In some implementations, the RF power amplifier 120 can include an inverter IN2 between the phase shifter 127 and the fourth switching unit 124. In these implementations, the third switching unit 123 and the fourth switching unit 124 are the same type of transistors. In some other implementations, the fourth switching unit 124 can be a different type of transistor from the third switching unit 123. For example, if the third switching unit 123 is a P-channel Silicon MOSFET, the fourth switching unit 124 can be an N-channel Silicon MOSFET. In these implementations, the RF power amplifier 120 does not include an inverter. In some implementations, the RF power amplifier 120 additionally includes a driver D4 between the phase shifter 127 and the fourth switching unit 124 to drive the fourth switching unit 124.

The transformer 125 is coupled between the node N9 and the node N11. The transformer 125 includes a primary and a secondary. Since the primary is separated from the secondary, the transformer 125 isolates the RF load 150 from the RF power amplifier 120 of the power converting system 100. In some implementations, the secondary of the transformer 125, the resonator 126, and the RF load 150 can be coupled to chassis ground. In some implementations, where the rectifier 110 is a Valley Fill rectifier, the switching units 121-124 dissipate maximum power when the rectifier 110 delivers peak output voltage and the RF power output of the power converting system 100 is the maximum.

The transformer 125 delivers RF power from the primary to the secondary. The secondary of the transformer 125 is coupled to the resonator 126. The resonator 126 is coupled to chassis ground. The power transferred from the primary to the secondary is transferred to the resonator 126 and the RF load 150. Where the resonant frequency of the resonator 126 is the same as the operating frequency of the RF power amplifier 120, the resonator 126 has low impedance, e.g., less than 1 ohm. Thus, nearly all the power transferred from the primary to the secondary is transferred to the RF load 150.

The phase shifter 127 couples the node N10 to both of the third switching unit 123 and the fourth switching unit 124. In response to the control signal received from the controller 170, the phase shifter 127 adjusts the phase of the RF clock and provides the phase-adjusted RF clock to both of the third switching unit 123 and the fourth switching unit 124 such that the output power of the RF power amplifier 120 is smoothly adjusted from zero to the maximum. Adjusting output power of the RF power amplifier 120 will be described in greater detail with reference to the FIG. 2C.

Figure 2B:
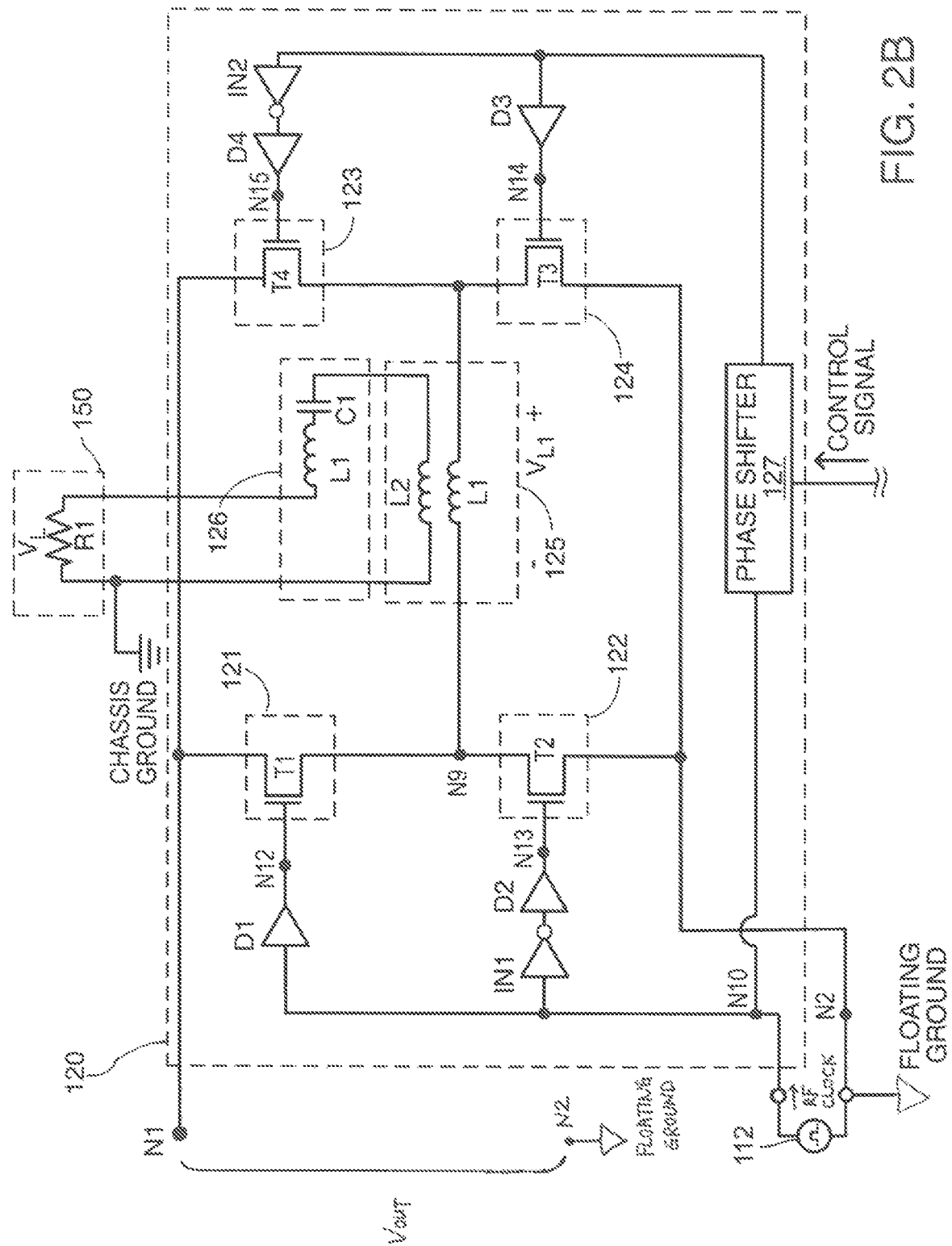
FIG. 2B is a diagram illustrating another example RF power amplifier including a phase shifter.

FIG. 2B illustrates another example RF power amplifier 100 including a phase shifter 127. In this example, the switching units 121-124 are implemented using N-channel Silicon MOSFETs T1-T4. Each of the switching units 121-124 can additionally include any suitable circuit elements. In some implementations, the switching units 121-124 can be implemented using different types of transistors or other circuit elements.

With reference to FIG. 2B, a drain of the transistor T1 is coupled to the node N1, a gate of the transistor T1 is coupled to a node 12, and a source of the transistor T1 is coupled to the node N9. In response to the RF clock, the transistor T1 is turned on or off. When the RF clock is high, the transistor T1 is turned on. When the RF clock is low, the transistor T1 is turned off.

A drain of the transistor T2 is coupled to the node N9, a gate of the transistor T2 is coupled to a node 13, and a source of the transistor T2 is coupled to the node N2. The RF clock is inverted by the inverter IN1, driven by the driver D1, and then, provided to the gate of the transistor T2 to turn on or off the transistor T2. When the RF clock is high, the transistor T2 is turned off. When the RF clock is low, the transistor T2 is turned on.

A drain of the transistor T3 is coupled to the node N11, a gate of the transistor T3 is coupled to a node N14, and a source of the transistor T3 is coupled to the node N2. In response to the RF clock that is driven by the driver D3, the transistor T3 is turned on or off. When the RF clock is high, the transistor T3 is turned on. When the RF clock is low, the transistor T3 is turned off.

A drain of the transistor T4 is coupled to the node N1, a gate of the transistor T4 is coupled to a node 15, and a source of the transistor T4 is coupled to the node N11. The RF clock is inverted by the inverter IN2, driven by the driver D4, and then, provided to the gate of the transistor T4 to turn on or off the transistor T4. When the RF clock is high, the transistor T4 is turned off. When the RF clock is low, the transistor T4 is turned on.

The transformer 125 includes a primary L1 and a secondary L2 to deliver the voltage ($V_{L1}$) between the node N9 and the node N11 into the load voltage ($V_L$). The transformer 125 includes two isolated coils L1, L2. These coils L1, L2 of the transformer 125 isolate the RF load 150 from the RF power amplifier 120 of the power converting system 100 as described above. The resonator 126 includes a resonant circuit including an inductor L1 and a capacitor C1. The RF load 150 is coupled to the resonator 126. In some implementations, the inductor L1 and the capacitor C1 have any suitable values of inductance and capacitance such that the resonant circuit of the resonator 126 has a resonant frequency that is the same as the operating frequency of the RF power amplifier 120 as determined by RF clock. For example, the resonant frequency of the resonator 126 and the operating frequency of the RF power amplifier 120 can be 13.56 MHz. Where the resonant frequency is the same as the operating frequency of the RF power amplifier 120, the resonator 126 has low impedance, e.g., less than 1 ohm, and nearly all the power from the secondary of the transformer is delivered to the RF load 150. In some implementations, the coupler 130 described with reference to FIGS. 1A and 1B can be coupled between the resonator 126 and the RF load 150.

The phase shifter 127 is coupled between the node N10 and both of the node N14 and the node N15. In response to the control signal received from the controller 170, the phase shifter 127 adjusts the phase of the RF clock and provides the phase-adjusted RF clock to both of the gate of the transistor T3 and the gate of the transistor T4 such that the output power of the RF power amplifier 120 is smoothly adjusted from zero to the maximum.

Figure 2C:
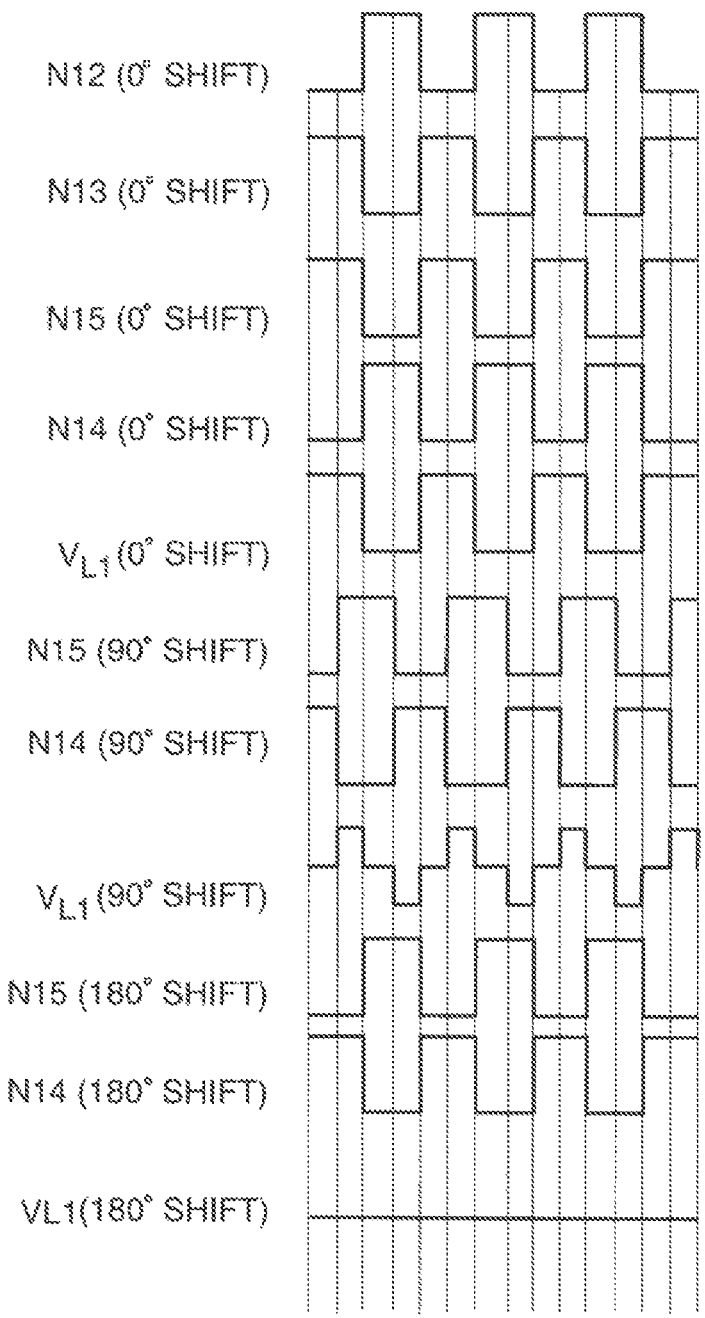
FIG. 2C is a diagram illustrating an example timing chart showing voltage levels at gates of transistors and a voltage across a transformer in FIG. 2B.

FIG. 2C illustrates an example timing chart showing voltage levels at the gates of the transistors T1-T4 and the voltage ($V_{L1}$) in FIG. 2B. Referring to FIG. 2B, the node 12 is coupled to the gate of the transistor T1, the node 13 is coupled to the gate of the transistor T2, the node N14 is coupled to the gate of the transistor T3, and the node 15 is coupled to the gate of the transistor T4. When the phase is not shifted, i.e., 0 degree phase shift, the voltage ($V_{L1}$) that is a voltage across the primary L1 of the transformer 125 is transitioned at the same timing that the RF clock is transitioned. When the phase shifter 127 shifts the phase of the RF clock by 90 degrees, the voltages at the nodes N12, N13 are not shifted, but the voltages at the nodes N14, N15 are shifted by 90 degrees. As a result, the RMS voltage ($V_{L1}$) is reduced comparing to the RMS voltage ($V_{L1}$) with 0 degree phase shift. When the phase shifter 127 shifts the phase of the RF clock by 180 degrees, the voltages at the nodes N12, N13 are not shifted, but the voltages at the nodes N14, N15 are shifted by 180 degrees. As a result, the voltage ($V_{L1}$) has zero output. Thus, by adjusting the phase of the RF clock, the RF power amplifier 120 can reduce the output, which is the voltage ($V_{L1}$), of the RF power amplifier 120 such that the output of the RF power amplifier 120 is smoothly adjusted from zero to the maximum. The current flowing in the secondary L2 of the transformer 125 is filtered by the resonator 126, which can only pass the RF clock frequency. Thus, the load voltage ($V_L$) across the RF load 150 becomes a sign wave.

Figure 3A:
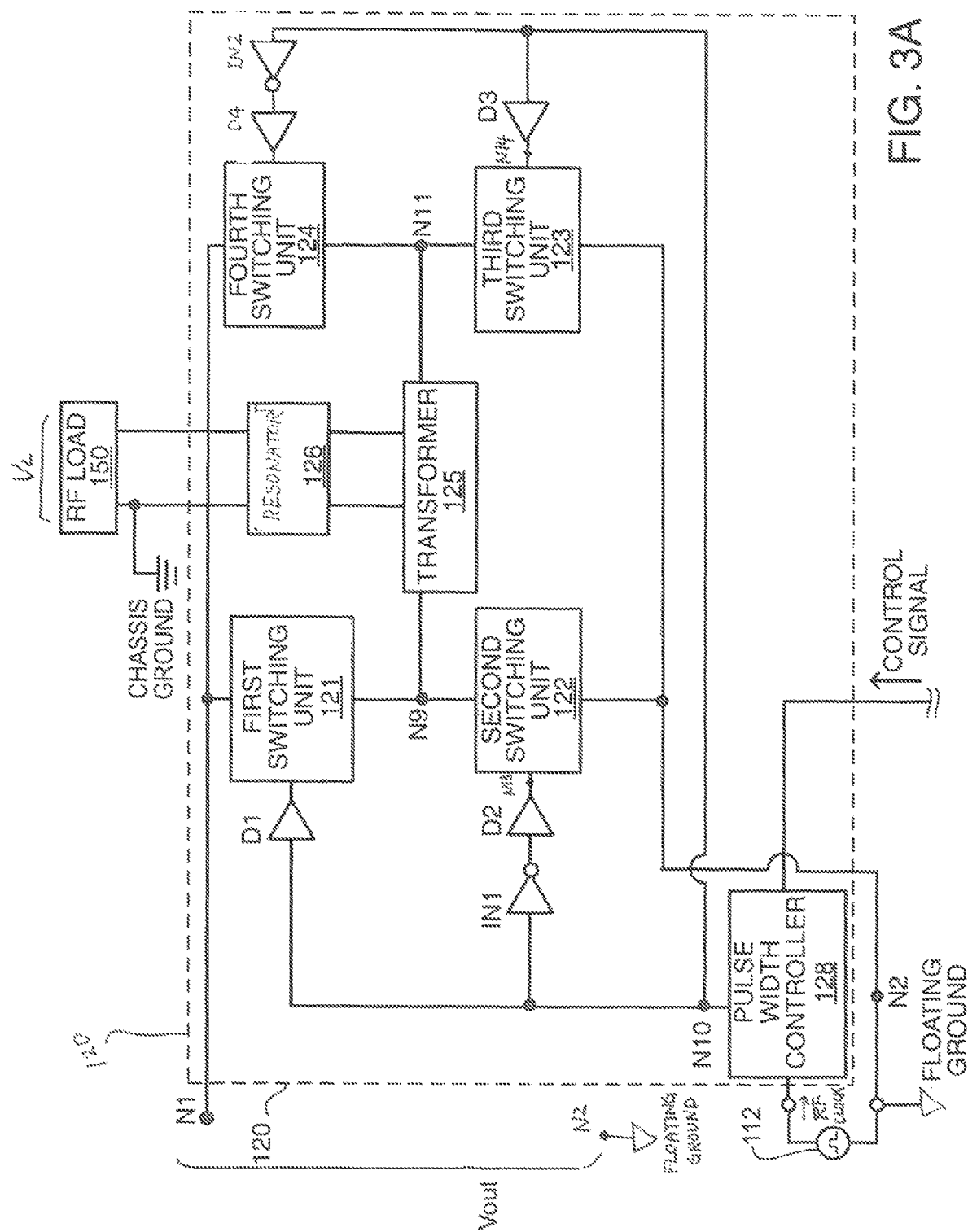
FIG. 3A is a diagram illustrating an example RF power amplifier including a pulse width controller.

FIG. 3A illustrates an example RF power amplifier including a pulse width controller. The RF power amplifier 120 can include the same elements described with reference to FIG. 2A except the phase shifter 127. Instead of the phase shifter 127, the RF power amplifier 120 in FIG. 3A includes a pulse width controller 128. The pulse width controller 128 controls a pulse width of the RF clock. In some implementations, the pulse width controller 128 can be an analog pulse width controller. In some other implementations, the pulse width controller 128 can be a digital pulse width controller. Where the phase shifter 127 in FIG. 2A is coupled to the third switching unit 123 and the fourth switching unit 124, but not coupled to the first switching unit 121 and the second switching unit 122, the pulse width controller 128 in FIG. 3A is coupled to all of the switching units 121-124. The pulse width controller 128 receives the RF clock as input and provides a pulse width-adjusted RF clock to the node N10. In particular, in response to the control signal received from the controller 170, the pulse width controller 128 adjusts the pulse width of the RF clock and provides the pulse width-adjusted RF clock to all of the switching units 121-124 such that the output power of the RF power amplifier 120 is smoothly adjusted from zero to the maximum based on the adjustment of the pulse width. The power output adjustment achieved by adjusting the pulse width of the RF clock will be described in greater detail with reference to the FIG. 3C.

Figure 3B:
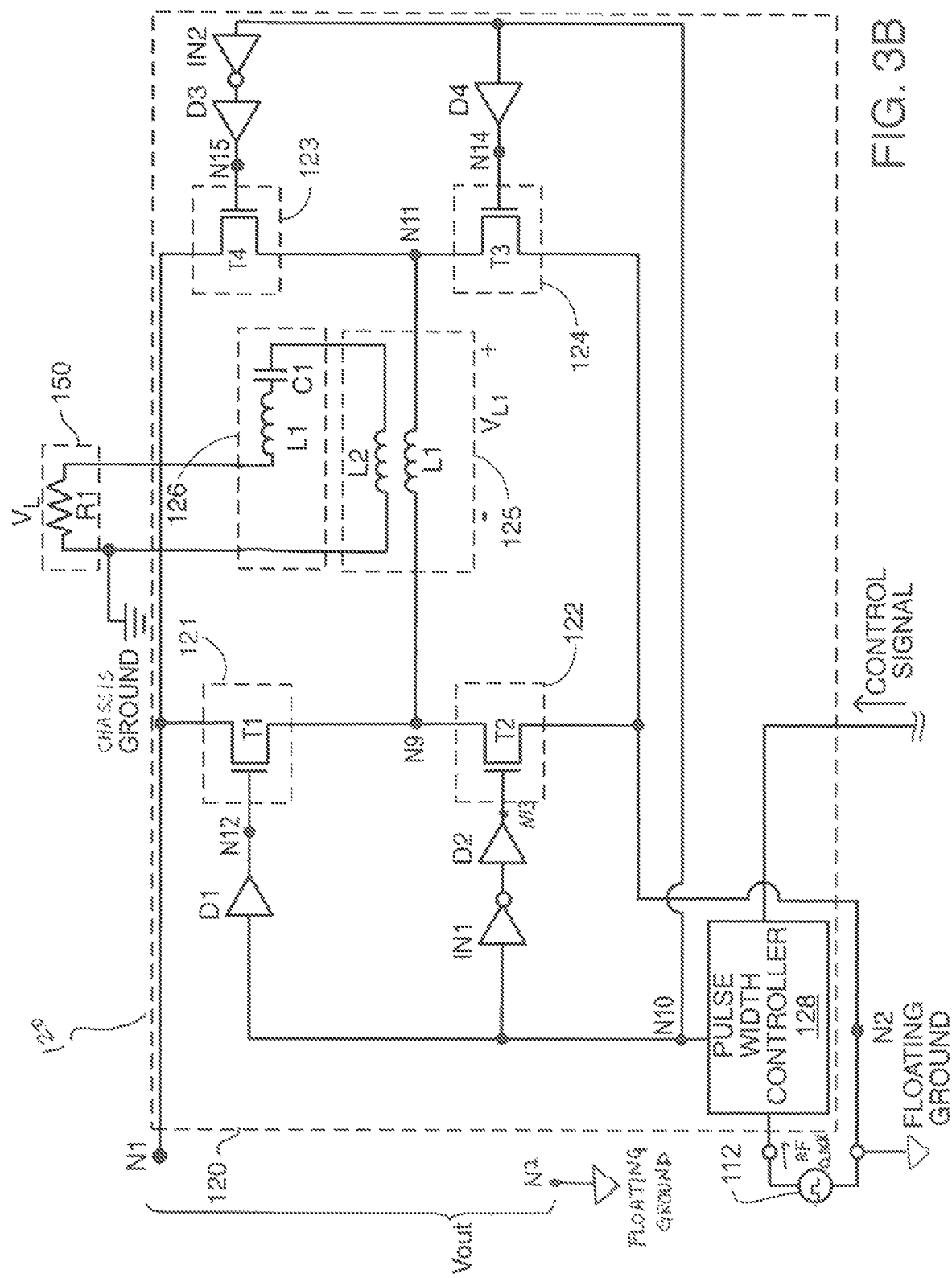
FIG. 3B is a diagram illustrating another example RF power amplifier including a pulse width controller.

FIG. 3B illustrates another example RF power amplifier including a pulse width controller. In this example, the switching units 121-124 are implemented using N-channel Silicon MOSFETs T1-T4. Each of the switching units 121-124 can additionally include any suitable circuit elements. In some implementations, the switching units 121-124 can be implemented using different types of transistors or other circuit elements.

The RF power amplifier 120 can include the same elements described with reference to FIG. 2B except the phase shifter 127. Instead of the phase shifter 127, the RF power amplifier 120 in FIG. 3B includes the pulse width controller 128. Where the phase shifter 127 in FIG. 2B is coupled to the gate of the transistor T3 and the gate of the transistor T4, but not coupled to the gate of the transistor T1 and the gate of the transistor T2, the pulse width controller 128 is respectively coupled to all of the gates of the transistors T1-T4. The pulse width controller 128 receives the RF clock as input and provides a pulse width-adjusted RF clock to the node N10. In particular, in response to the control signal received from the controller 170, the pulse width controller 128 adjusts the pulse width of the RF clock and provides the pulse width-adjusted RF clock to all of the transistors T1-T4 such that the output power of the RF power amplifier 120 is smoothly adjusted from zero to the maximum. The output power adjustment achieved by the pulse width of the RF clock will be described in greater detail with reference to the FIG. 3C.

Figure 3C:
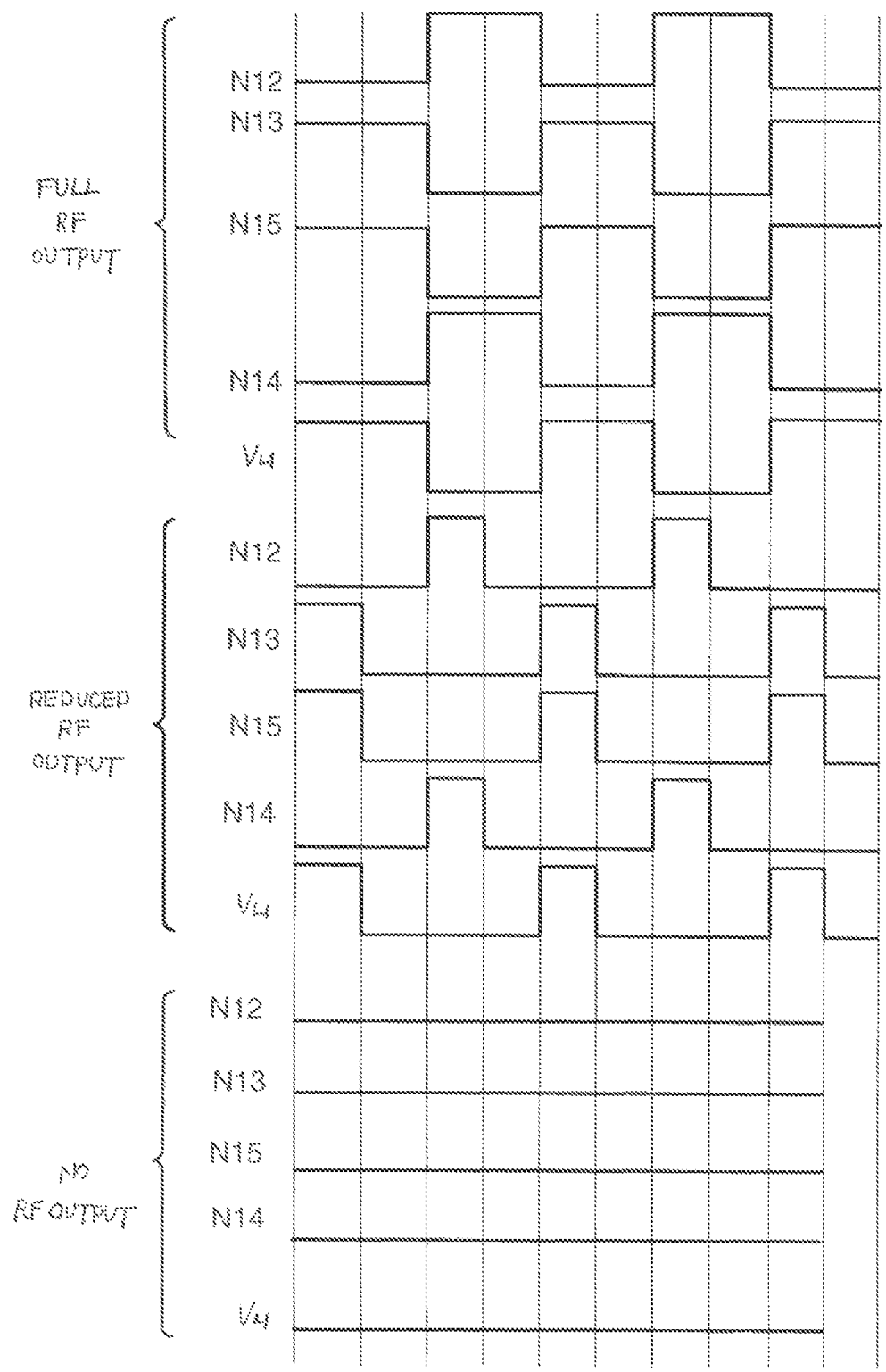
FIG. 3C is a diagram illustrating an example timing chart showing voltage levels at gates of transistors and a voltage across a transformer in FIG. 3B.

FIG. 3C illustrates an example timing chart showing voltage levels at the gates of the transistors T1-T4 and the voltage ($V_{L1}$) in FIG. 3B. Referring to FIG. 3B, the node 12 is coupled to the gate of the transistor T1, the node 13 is coupled to the gate of the transistor T2, the node N14 is coupled to the gate of the transistor T3, and the node 15 is coupled to the gate of the transistor T4. When the pulse width of the RF clock is not adjusted, the voltage ($V_{L1}$) that is a voltage across the primary L1 of the transformer 125 is transitioned at the same timing that the RF clock is transitioned. When the pulse width controller 128 adjusts, i.e., reduces, the pulse width of the RF clock by 50%, the voltages at the nodes N12-N15 are respectively adjusted. As a result, the voltage ($V_{L1}$) is reduced by 50% comparing to the voltage ($V_{L1}$) when a pulse width of the RF clock is not adjusted. When the pulse width controller 128 adjusts, i.e., reduces, the pulse width of the RF clock to zero, the voltage ($V_{L1}$) has zero output. Thus, by adjusting the pulse width of the RF clock, the RF power amplifier 120 can reduce the output of the RF power amplifier 120, which is the voltage ($V_{L1}$), such that the output power of the RF power amplifier 120 is smoothly adjusted from zero to the maximum.

Figure 4A:
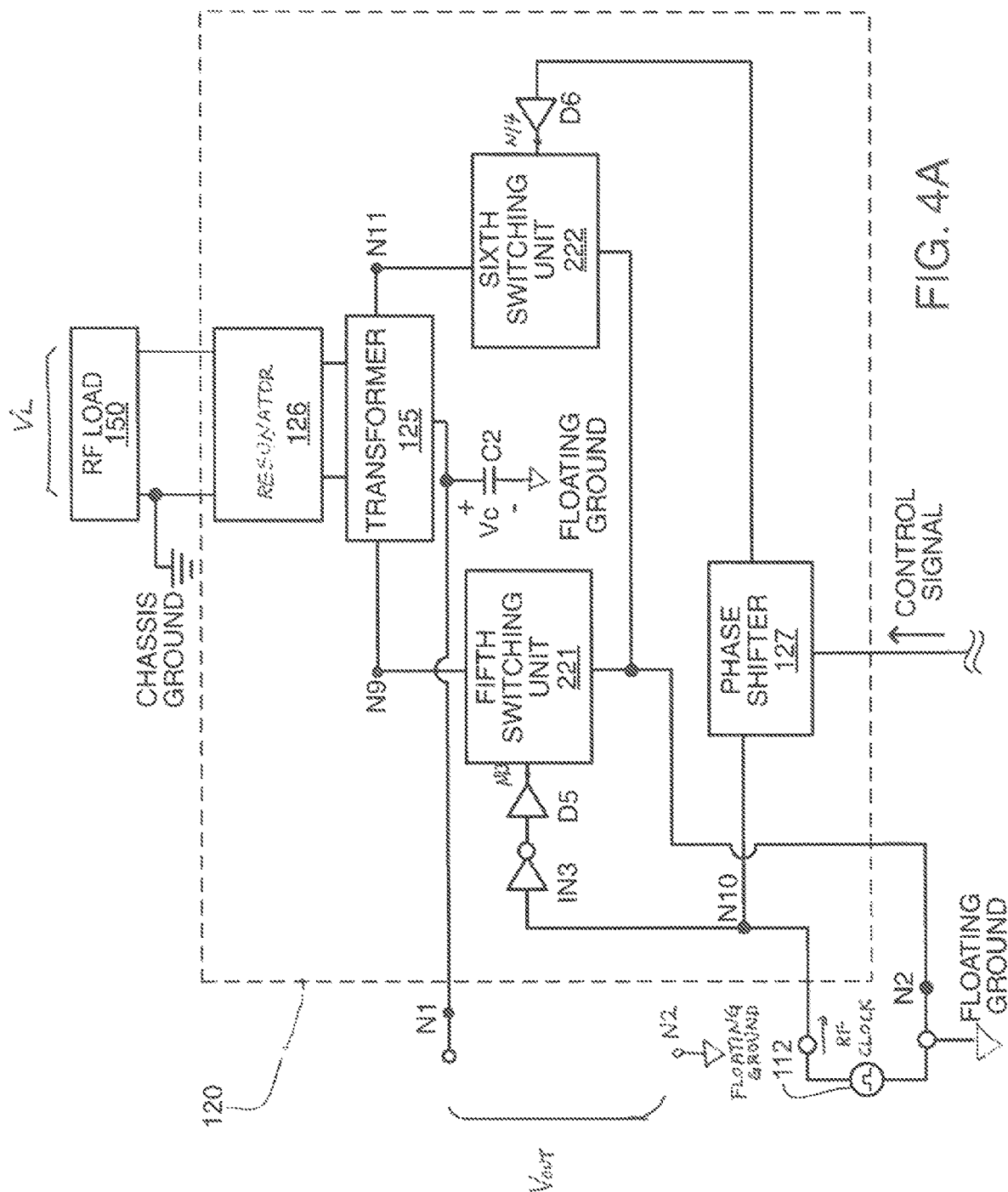
FIG. 4A is a diagram illustrating another example RF power amplifier including a phase shifter.

FIG. 4A illustrates an example RF power amplifier including a phase shifter. The RF power amplifier 120 can include the same elements described with reference to FIG. 2A except that the RF power amplifier 120 includes two switching units, i.e., a fifth switching unit 221 and sixth switching unit 222 instead of the switching units 121-124. The switching units 221, 222 can be implemented with a various kinds of transistors including, but not limited to: P-channel MOSFETs, N-channel MOSFETs, LDMOS transistors, Silicon MOSFETs, Silicon Carbide MOSFETs, Silicon Bipolar Transistors, Silicon IGBTs, Silicon JFETs, Silicon Carbide JFETs, Gallium Nitride High Electron Mobility Transistors (GaN HEMTs), GaAs MESFETs, or any suitable types of transistors. In some implementations, the switching units 221, 222 are the same type of transistors. For example, the switching units 221, 222 are N-channel Silicon MOSFETs. In these implementations, the RF power amplifier 120 can include an inverter for the fifth switching unit 221. Alternatively, the RF power amplifier 120 can include an inverter for the sixth switching unit 222. In some other implementations, the fifth switching unit 221 is a different type of transistor from the sixth switching unit 222. For example, the fifth switching unit 221 includes a P-channel Silicon MOSFET and the sixth switching unit 222 includes a N-channel Silicon MOSFET. In these implementations, the RF power amplifier 120 does not include inverters. The details of the switching units 221-222 are described in greater detail below.

The fifth switching unit 221 is coupled between the node N9 and the node N2. The fifth switching unit 221 is turned on or off in response to the RF clock. For example, when the RF clock is high, the fifth switching unit 221 is turned off. When the RF clock is low, the fifth switching unit 221 is turned on. In some implementations, the RF power amplifier 120 can include an inverter IN3 between the node N10 and the fifth switching unit 221. In these implementations, the fifth switching unit 221 and the sixth switching unit 222 are the same type of transistors. In some implementations, the sixth switching unit 222 can be a different type of transistor from the fifth switching unit 221. For example, where the fifth switching unit 221 is a N-channel Silicon MOSFET, the sixth switching unit 222 is a P-channel Silicon MOSFET. In these implementations, the RF power amplifier 120 does not include the inverter IN3. In some implementations, the RF power amplifier 120 additionally includes a driver D5 between the node N10 and the fifth switching unit 221 to drive the fifth switching unit 221.

The sixth switching unit 222 is coupled between the node N2 and a node N11. The sixth switching unit 222 is turned on or off in response to the RF clock. For example, when the RF clock is high, the sixth switching unit 222 is turned on. When the RF clock is low, the sixth switching unit 222 is turned off. In some implementations, the RF power amplifier 120 additionally includes a driver D6 that is coupled between the phase shifter 127 and the sixth switching unit 222 to drive the sixth switching unit 222.

The transformer 125 is coupled between the node N9 and the node N11. The transformer 125 includes a primary coupled between the node N9 and the node N11 and a secondary coupled to the resonator 126. The RF load 150 is coupled to the resonator 126. The node N1 is coupled to a portion of the transformer 125. In particular, the node N1 can be coupled to the center of the primary coil of the transformer 125. The transformer 125 delivers power from the primary to the secondary and the transferred power to the secondary is transferred to the resonator 126 and the RF load 150. In this example, the resonator 126 is coupled to chassis ground. Where the resonant frequency of the resonator 126 is the same as the operating frequency of the RF power amplifier 120, the resonator 126 has low impedance, e.g., less than 1 ohm. Thus, nearly all the power transferred from the primary to the secondary is transferred to the RF load 150.

The phase shifter 127 couples the node N10 to the sixth switching unit 222. In response to the control signal received from the controller 170, the phase shifter 127 adjusts the phase of the RF clock and provides the phase-adjusted RF clock to both of the fifth switching unit 221 and the sixth switching unit 222 such that the output power of the RF power amplifier 120 is smoothly adjusted from zero to the maximum based on the adjustment of the phase.

Figure 4B:
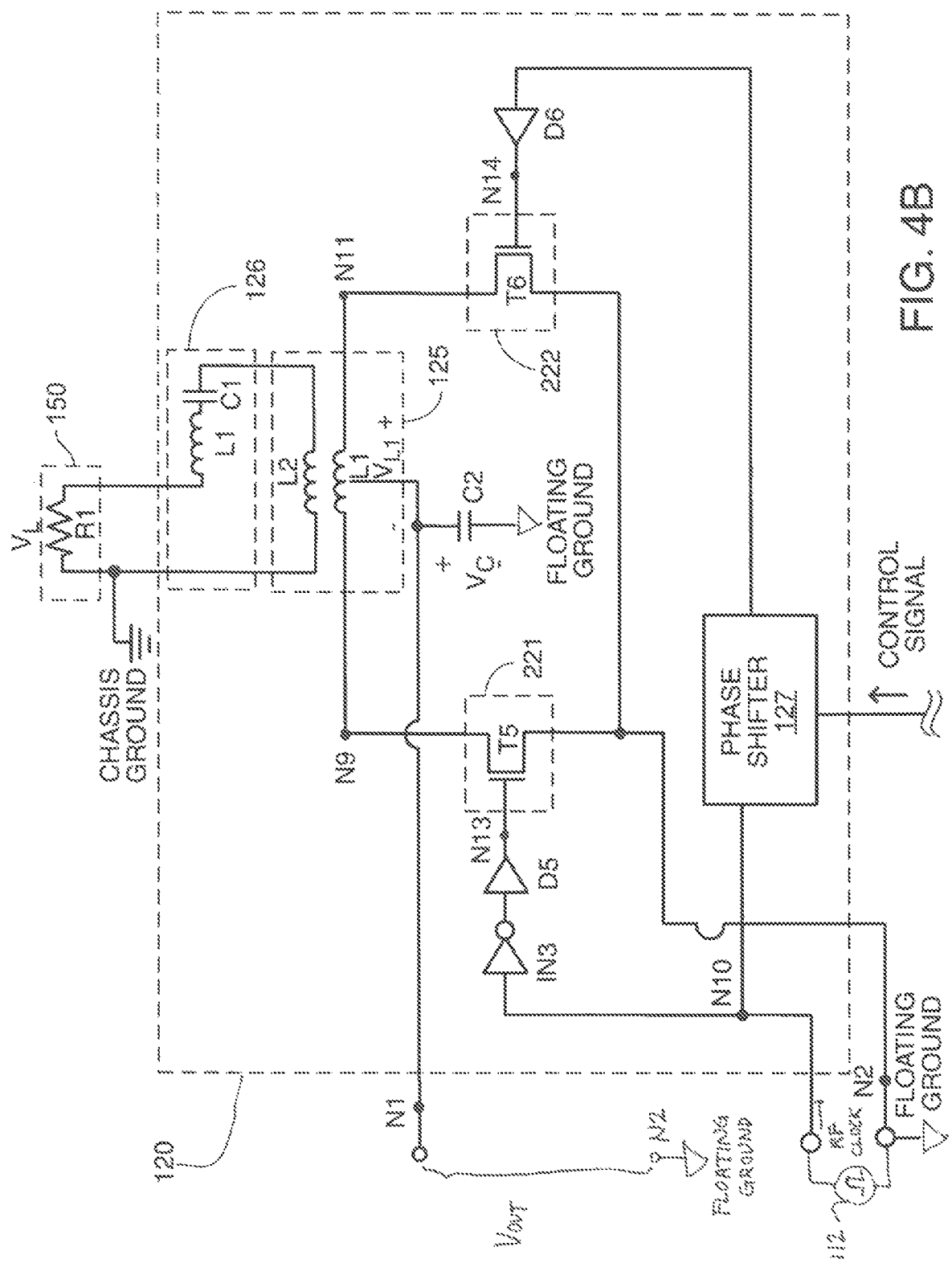
FIG. 4B is a diagram illustrating another example RF power amplifier including a phase shifter.

FIG. 4B illustrates another example RF power amplifier including a phase shifter. In this example, the switching units 221, 222 are implemented using N-channel Silicon MOSFETs T5, T6. Each of the switching units 221, 222 can additionally include any suitable circuit elements. In some implementations, the switching units 221, 222 can be implemented using different types of transistors or other circuit elements.

With reference to FIG. 4B, a drain of the transistor T5 is coupled to the node N9, a gate of the transistor T2 is coupled to the node 13, and a source of the transistor T2 is coupled to the node N2. The RF clock is inverted by the inverter IN3, driven by the driver D5, and then, provided to the gate of the transistor T5 to turn on or off the transistor T5. For example, when the RF clock is high, the transistor T5 is turned off. When the RF clock is low, the transistor T5 is turned on.

A drain of the transistor T6 is coupled to the node N11, a gate of the transistor T6 is coupled to a node N14, and a source of the transistor T6 is coupled to the node N2. In response to the RF clock that is driven by the driver D6, the transistor T6 is turned on or off. For example, where the phase of the RF clock is not shifted by the phase shifter 127, when the RF clock is high, the transistor T6 is turned on. When the RF clock is low, the transistor T6 is turned off. As another example, where the phase of the RF clock is shifted by the phase shifter 127, when the RF clock is high, the transistor T6 can be turned on or off based on how much the phase of the RF clock is shifted. When the RF clock is low, the transistor T6 can be turned on or off based on how much the phase of the RF clock is shifted.

The transformer 125 includes a primary L1 and a secondary L2 to deliver the voltage ($V_{L1}$) between the node N9 and the node N11 into the load voltage ($V_L$). The transformer 125 includes two isolated coils L1, L2. These coils L1, L2 of the transformer 125 isolate the RF load 150 from the RF power amplifier 120 of the power converting system 100 as described above. The resonator 126 includes a resonant circuit including an inductor L1 and a capacitor C1. The RF load 150 is coupled to the resonator 126. In some implementations, the inductor L1 and the capacitor C1 have any suitable values of inductance and capacitance such that the resonant circuit of the resonator 126 has a resonant frequency that is the same as the operating frequency of the RF power amplifier 120. For example, the resonant frequency of the resonator 126 and the operating frequency of the RF power amplifier 120 can be 13.56 MHz. Where the resonant frequency is the same as the operating frequency of the RF power amplifier 120, the resonator 126 has low impedance, e.g., less than 1 ohm, and nearly all the power from the secondary of the transformer is delivered to the RF load 150. In some implementations, the coupler 130 described with reference to FIGS. 1A and 1B can be coupled between the resonator 126 and the RF load 150.

The phase shifter 127 is coupled between the node N10 and the node N14. In response to the control signal received from the controller 170, the phase shifter 127 adjusts the phase of the RF clock and provides the phase-adjusted RF clock to both of the gate of the transistor T5 and the gate of the transistor T6 such that the output power of the RF power amplifier 120 is smoothly adjusted from zero to maximum.

Figure 5A:
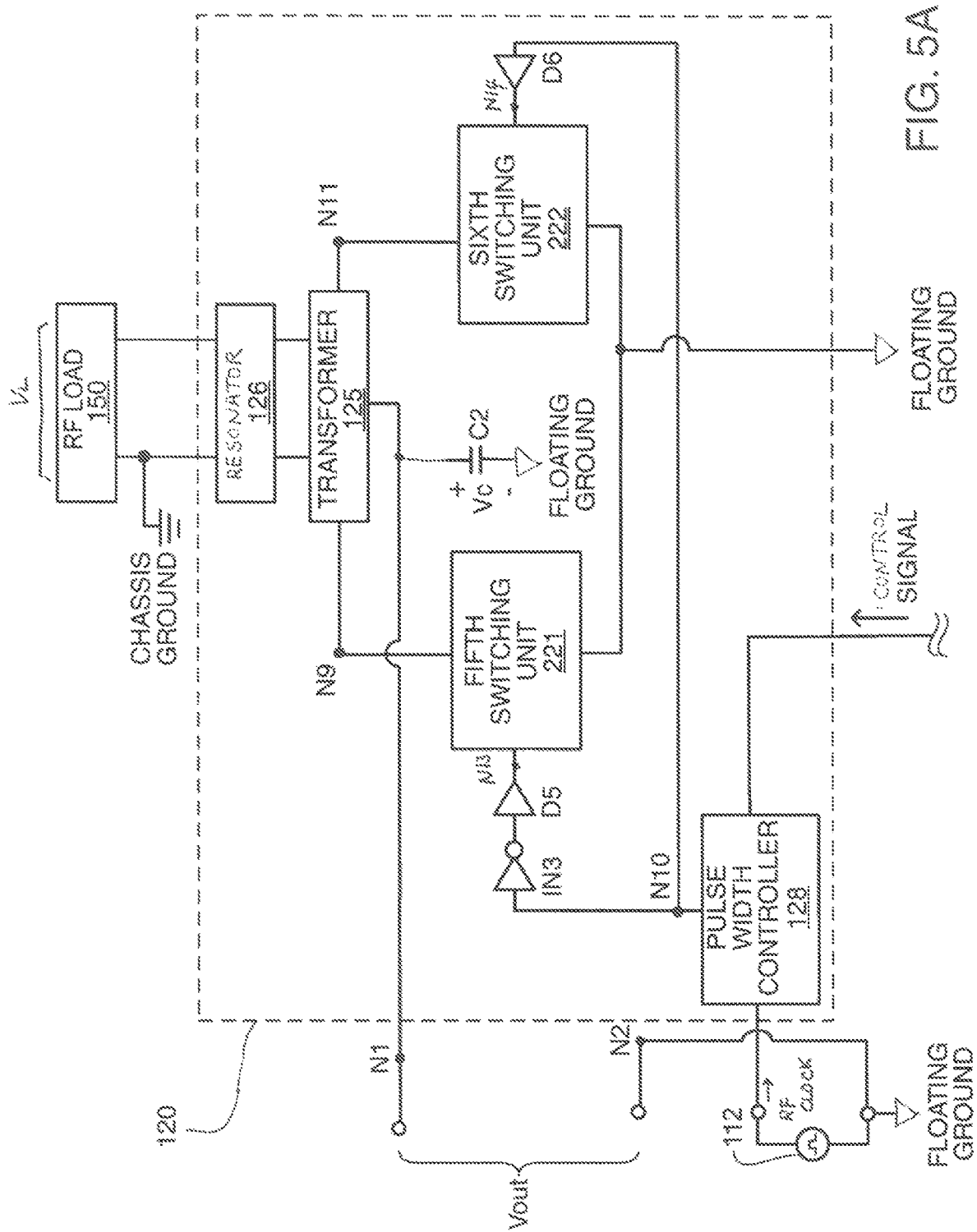
FIG. 5A is a diagram illustrating another example RF power amplifier including a pulse width controller.

FIG. 5A illustrates an example RF power amplifier including a pulse width controller. The RF power amplifier 120 can include the same elements described with reference to FIG. 4A except the phase shifter 127. Instead of the phase shifter 127, the RF power amplifier 120 in FIG. 5A includes the pulse width controller 128. The pulse width controller 128 can be a pulse width controller described with reference to FIG. 3A. The pulse width controller 128 in FIG. 5A is coupled to both of the fifth switching unit 221 and the sixth switching unit 222. The pulse width controller 128 receives the RF clock as input and provides a pulse width-adjusted RF clock at the node N10. In particular, in response to the control signal received from the controller 170, the pulse width controller 128 adjusts the pulse width of the RF clock and provides the pulse width-adjusted RF clock to all of the switching units 221, 222 such that the output power of the RF power amplifier 120 is smoothly adjusted from zero to maximum based on the adjustment of the pulse width.

Figure 5B:
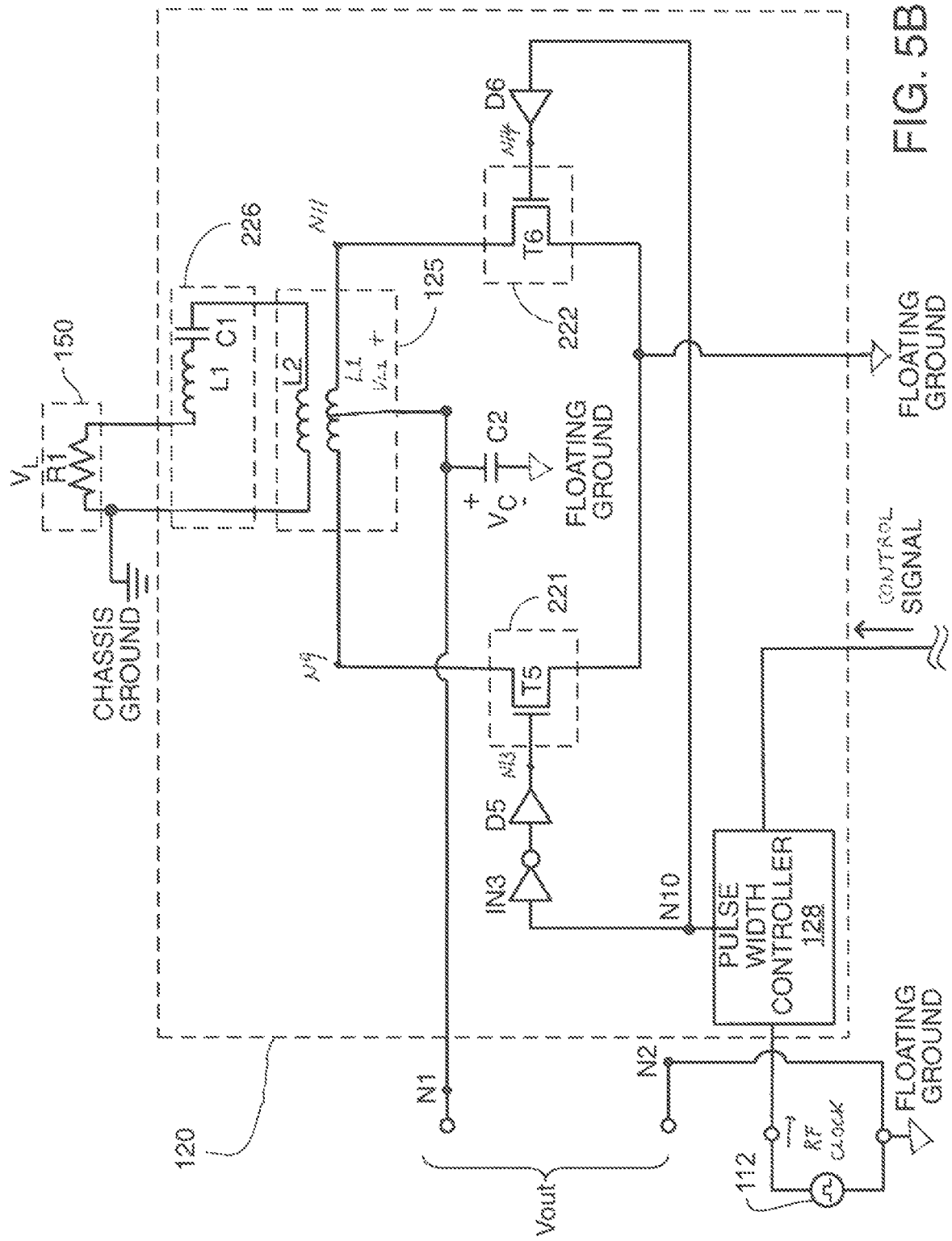
FIG. 5B is a diagram illustrating another example RF power amplifier including a pulse width controller.

FIG. 5B illustrates another example RF power amplifier including a pulse width controller. In this example, the switching units 221, 222 are implemented using N-channel Silicon MOSFETs T5, T6. Each of the switching units 221, 222 can additionally include any suitable circuit elements. In some implementations, the switching units 221, 222 can be implemented using different types of transistors or other circuit elements.

The RF power amplifier 120 can include the same elements described with reference to FIG. 4B except the phase shifter 127. Instead of the phase shifter 127, the RF power amplifier 120 in FIG. 5B includes the pulse width controller 128. The pulse width controller 128 is respectively coupled to all of the gates of the transistors T5, T6. The pulse width controller 128 receives the RF clock as input and provides a pulse width-adjusted RF clock at the node N10. In particular, in response to the control signal received from the controller 170, the pulse width controller 128 adjusts the pulse width of the RF clock and provides the pulse width-adjusted RF clock to all of the transistors T5, T6 such that the output of the RF power amplifier 120 is smoothly adjusted from zero to the maximum based on the adjustment of the pulse width.

While this document contains many specific implementation details, these should not be construed as limitations on the scope what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A power converting system comprising:
    a rectifier configured to convert an input voltage into an output voltage and including an output node that is coupled to a floating ground;
    a radio frequency (RF) power amplifier coupled to the rectifier and configured to generate a load voltage based on an RF clock and the output voltage;
    a detector coupled to the RF power amplifier and configured to detect the load voltage of the RF power amplifier;
    an integrator coupled to the detector and configured to generate a direct current (DC) voltage based on the detected load voltage;
    a controller coupled to the integrator and configured to, based on the DC voltage, generate a control signal to adjust one or more features of the RF power amplifier; and
    a reference voltage generator configured to generate a reference voltage and provide the reference voltage to the controller, the reference voltage generator having a first terminal coupled to the floating ground and a second terminal coupled to the controller,
    wherein the RF power amplifier includes:
        a transformer including a primary side and a secondary side separated from the primary side, the transformer being configured to transfer RF power from the primary side to the secondary side,
        a plurality of switching units coupled to the primary side of the transformer, each of the plurality of switching units having a terminal coupled to the floating ground,
        a RF clock generator disposed between the RF power amplifier and the floating ground and configured to provide the RF clock to the RF power amplifier, and
        a resonator coupled between the secondary side of the transformer and a RF load, the resonator having a terminal coupled to a chassis ground, and
    wherein the RF power amplifier is configured to, based on the transformer transferring the RF power from the primary side to the secondary side, transfer the RF power from the secondary side to the RF load through the resonator.

2. The power converting system of claim 1,
    wherein the controller is configured to:
        compare the DC voltage to the reference voltage,
        based on the comparison of the DC voltage to the reference voltage, generate the control signal.

3. The power converting system of claim 2, wherein the reference voltage represents a desired RF output power of the power converting system.

4. The power converting system of claim 1, further comprising:
    a coupler coupled to the RF power amplifier and configured to transfer output of the RF power amplifier to the detector.

5. The power converting system of claim 4, wherein the coupler is a directional coupler that is configured to sense the output of the RF power amplifier delivered to the RF load.

6. The power converting system of claim 1, wherein the load voltage of the RF power amplifier is provided to the RF load.

7. The power converting system of claim 6, wherein the RF load includes one or more resistors.

8. The power converting system of claim 1, wherein a frequency of the RF clock is an operating frequency of the power converting system.

9. The power converting system of claim 1, wherein the controller is configured to:
    based on the DC voltage, generate the control signal to adjust a phase of the RF clock.

10. The power converting system of claim 9, wherein the RF power amplifier includes:
    a phase shifter configured to:
        receive the control signal from the controller, and
        based on the control signal, adjust the phase of the RF clock.

11. The power converting system of claim 10, wherein the plurality of switching units include:
    a first switching unit that is configured to receive the RF clock,
    a second switching unit that is configured to receive the RF clock,
    a third switching unit that is configured to receive the RF clock through the phase shifter, and
    a fourth switching unit that is configured to receive the RF clock through the phase shifter, wherein the phase shifter is configured to adjust the phase of the RF clock and provide the phase adjusted RF clock to the third switching unit and the fourth switching unit.

12. The power converting system of claim 11, wherein the second switching unit and the third switching unit are coupled to the floating ground.

13. The power converting system of claim 11, wherein the RF power amplifier further includes:
a resonant circuit having a first resonant frequency, and
wherein an operating frequency of the RF power amplifier is equal to the first resonant frequency.

14. The power converting system of claim 13, wherein the operating frequency of the RF power amplifier is between 100 kHz and 100MHz.

15. The power converting system of claim 10, wherein the plurality of switching units include:
a first switching unit that is configured to receive the RF clock, and
a second switching unit that is configured to receive the RF clock, and
wherein the phase shifter is configured to adjust the phase of the RF clock and provide the phase adjusted RF clock to the first switching unit and the second switching unit.

16. The power converting system of claim 15, wherein the first switching unit and the second switching unit are coupled to the floating ground.

17. The power converting system of claim 15, wherein the RF power amplifier further includes:
a resonant circuit having a first resonant frequency, and
wherein an operating frequency of the RF power amplifier is equal to the first resonant frequency.

18. The power converting system of claim 17, wherein the operating frequency of the RF power amplifier is between 100 kHz and 100MHz.

19. The power converting system of claim 1, wherein the controller is configured to:
based on the DC voltage, generate the control signal to adjust a pulse width of the RF clock.

20. The power converting system of claim 19, wherein the RF power amplifier includes:
a pulse width controller that is configured to:
receive the control signal from the controller, and
based on the control signal, adjust the pulse width of the RF clock.

21. The power converting system of claim 20, wherein the plurality of switching units include:
a first switching unit that is configured to receive the RF clock through the pulse width controller,
a second switching unit that is configured to receive the RF clock through the pulse width controller,
a third switching unit that is configured to receive the RF clock through the pulse width controller, and
a fourth switching unit that is configured to receive the RF clock through the pulse width controller,
wherein the pulse width controller is configured to adjust the pulse width of the RF clock and provide the pulse width-adjusted RF clock to the first switching unit, the second switching unit, the third switching unit, and the fourth switching unit.

22. The power converting system of claim 21, wherein the second switching unit and the third switching unit are coupled to the floating ground.

23. The power converting system of claim 21, wherein the RF power amplifier further includes:
a resonant circuit having a first resonant frequency, and
wherein an operating frequency of the RF power amplifier is equal to the first resonant frequency.

24. The power converting system of claim 23, wherein the operating frequency of the RF power amplifier is between 100 kHz and 100MHz.

25. The power converting system of claim 20, wherein the plurality of switching units include:
a first switching unit that is configured to receive the RF clock, and
a second switching unit that is configured to receive the RF clock, and
wherein the pulse width controller is configured to adjust the pulse width of the RF clock and provide the pulse width-adjusted RF clock to the first switching unit and the second switching unit.

26. The power converting system of claim 25, wherein the first switching unit and the second switching unit are coupled to the floating ground.

27. The power converting system of claim 25, wherein the RF power amplifier further includes:
a resonant circuit having a first resonant frequency, and
wherein an operating frequency of the RF power amplifier is equal to the first resonant frequency.

28. The power converting system of claim 27, wherein the operating frequency of the RF power amplifier is between 100 kHz and 100MHz.

29. The power converting system of claim 1, wherein the rectifier is a Valley Fill rectifier.

30. The power converting system of claim 1, wherein an operating frequency of the RF power amplifier is between 13 and 14 MHz.

31. The power converting system of claim 1, wherein the floating ground is isolated from the chassis ground.

* * * * *